(12) United States Patent
Yao et al.

(10) Patent No.: US 7,105,393 B2
(45) Date of Patent: Sep. 12, 2006

(54) STRAINED SILICON LAYER FABRICATION WITH REDUCED DISLOCATION DEFECT DENSITY

(75) Inventors: Liang-Gi Yao, Hsing-Chu (TW); Tien-Chih Chang, Taipei (TW); CC Lin, HsinChu (TW); Shin-Chang Chen, Hsin-Chu (TW); Mong-Song Liang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 139 days.

(21) Appl. No.: 10/769,316

(22) Filed: Jan. 30, 2004

(65) Prior Publication Data

US 2005/0170577 A1 Aug. 4, 2005

(51) Int. Cl.
*H01L 21/338* (2006.01)
(52) U.S. Cl. ...................... 438/167; 438/478; 438/652; 257/347
(58) Field of Classification Search ................ 438/137, 438/167
See application file for complete search history.

(56) References Cited

U.S. PATENT DOCUMENTS

| | | | | |
|---|---|---|---|---|
| 5,461,250 A | * | 10/1995 | Burghartz et al. | 257/347 |
| 5,534,713 A | | 7/1996 | Ismail et al. | 257/24 |
| 5,759,898 A | | 6/1998 | Ek et al. | 438/291 |
| 5,891,769 A | | 4/1999 | Liaw et al. | 438/167 |
| 6,326,667 B1 | | 12/2001 | Sugiyama et al. | 257/347 |

\* cited by examiner

*Primary Examiner*—Carl Whitehead, Jr.
*Assistant Examiner*—Colleen E. Rodgers
(74) *Attorney, Agent, or Firm*—Tung & Associates

(57) ABSTRACT

A strained silicon layer fabrication employs a substrate having successively formed thereover: (1) a first silicon-germanium alloy material layer; (2) a first silicon layer; (3) a second silicon-germanium alloy material layer; and (4) a second silicon layer. Within the fabrication each of the first silicon-germanium alloy layer and the second silicon-germanium alloy layer is formed of a thickness less than a threshold thickness for dislocation defect formation, such as to provide attenuated dislocation defect formation within the strained silicon layer fabrication.

12 Claims, 1 Drawing Sheet

STRAINED SILICON LAYER FABRICATION WITH REDUCED DISLOCATION DEFECT DENSITY

BACKGROUND OF THE INVENTION

1. Field of the Invention

The present invention relates generally to strained silicon layer structures employed within semiconductor products. More particularly, the present invention relates to reduced dislocation defect density strained silicon layer structures employed within semiconductor products.

2. Description of the Related Art

As semiconductor product performance requirements have increased, so also have evolved novel semiconductor materials and structures which provide enhanced semiconductor product performance. Included among such novel materials and structures are strained silicon materials and structures which may be employed as substrates when forming semiconductor devices. Strained silicon materials and structures are desirable as semiconductor substrates insofar as strained silicon materials provide for enhanced carrier mobility and thus enhanced performance of semiconductor devices.

While strained silicon materials and structures are thus desirable in the art of semiconductor fabrication, they are nonetheless not entirely without problems. In that regard, it is often difficult in the art of semiconductor fabrication to provide strained silicon layer structures with attenuated strain induced defects, such as strain induced dislocation defects.

It is thus desirable in the semiconductor fabrication art to provide strained silicon layer structures with attenuated strain induced defects.

It is towards the foregoing object that the present invention is directed.

Various strained silicon layer structures having desirable properties, and methods for fabrication thereof, have been disclosed in the semiconductor fabrication art.

Included among the strained silicon layer structures and methods, but not limiting among the strained silicon layer structures and methods, are strained silicon layer structures and methods disclosed within: (1) Ismail et al., in U.S. Pat. No. 5,534,713 (a strained silicon layer structure suitable for fabrication of complementary metal oxide semiconductor (CMOS) field effect transistor (FET) devices); (2) Ek et al., in U.S. Pat. No. 5,759,898 (a strained silicon layer structure with attenuated dislocation defects); (3) Liaw et al., in U.S. Pat. No. 5,891,769 (a thermal annealing method for forming a strained silicon layer structure); and (4) Sugiyama et al., in U.S. Pat. No. 6,326,667 (an oxygen implant method for forming a strained silicon layer structure).

The teachings of each of the foregoing references are incorporated herein fully by reference.

Desirable in the semiconductor fabrication art are additional strained silicon layer structures with attenuated strain induced defects.

It is towards the foregoing object that the present invention is directed.

SUMMARY OF THE INVENTION

A first object of the invention is to provide a strained silicon layer structure for use within a semiconductor product.

A second object of the invention is to provide the strained silicon layer structure in accord with the first object of the invention, wherein the strained silicon layer structure has attenuated strain induced defects.

In accord with the objects of the invention, the invention provides a strained silicon layer fabrication and a method for fabrication thereof.

The strained silicon layer fabrication comprises a substrate, a first silicon-germanium alloy layer formed over the substrate, a first silicon layer formed upon the first silicon-germanium alloy layer, at least a second silicon-germanium alloy layer, formed upon the first silicon layer; and at least a second silicon layer formed upon the second silicon-germanium alloy layer. Within the strained silicon layer fabrication each of the first silicon-germanium alloy layer and the second silicon-germanium alloy layer is formed to a thickness less than a threshold thickness for dislocation defect formation.

The strained silicon layer fabrication of the present invention contemplates a method for forming the strained silicon layer fabrication of the invention.

The present invention provides a strained silicon layer structure for use within a semiconductor product, wherein the strained silicon layer structure has attenuated strain induced defects.

The present invention realizes the foregoing object within the context of a multiple layer silicon-germanium alloy sub-layer/silicon sub-layer laminate strained silicon layer fabrication by forming each silicon-germanium alloy sub-layer to a thickness less than a threshold thickness for dislocation defect formation. By employing this limitation with respect to silicon-germanium alloy sub-layer thicknesses dislocations are trapped within the strained silicon layer fabrication and dislocation defects are attenuated.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a strained silicon layer structure for use within a semiconductor product, wherein the strained silicon layer structure has attenuated dislocation defects.

The present invention realizes the foregoing object within the context of a multiple layer silicon-germanium alloy sub-layer/silicon sub-layer laminate strained silicon layer fabrication by forming each silicon-germanium alloy sub-layer to a thickness less than a threshold thickness for dislocation defect formation.

Figure 1:
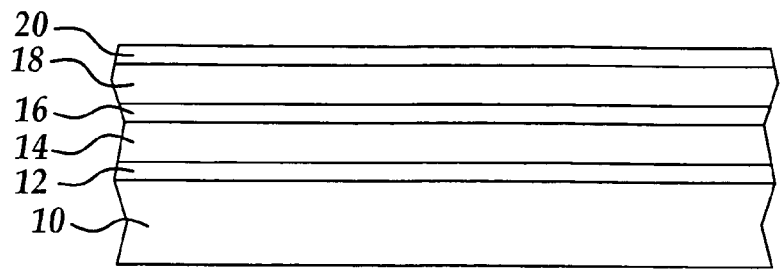
FIG. 1 and FIG. 2 show a pair of schematic cross-sectional diagrams illustrating the results of progressive stages of forming a strained silicon layer fabrication in accord with a preferred embodiment of the invention.
Figure 2:
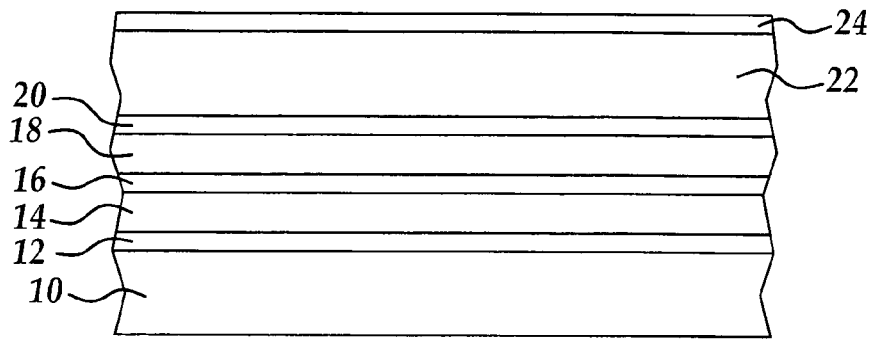

FIG. 1 and FIG. 2 show a pair of schematic cross-sectional diagrams illustrating the results of progressive stages of forming a strained silicon layer fabrication in accord with a preferred embodiment of the invention.

Shown in FIG. 1 a substrate 10 having formed thereupon and thereover a series of five blanket layers. The series of five blanket layers comprises: (1) an optional seed layer 12 formed upon the substrate 10; (2) a first silicon-germanium alloy layer 14 formed upon the seed layer 12; (3) a first silicon layer 16 formed upon the first silicon-germanium alloy layer 14; (4) a second silicon-germanium alloy layer 18 formed upon the first silicon layer 16; and (5) a second silicon layer 20 formed upon the second silicon-germanium alloy layer 18.

Within the invention, the substrate 10 is typically a monocrystalline silicon semiconductor substrate, preferably of a (100) crystallographic orientation, but other crystallographic orientations may also be employed.

Within the invention, the optional seed layer 12 is typically formed of silicon (optionally with an appropriate dopant) formed employing an epitaxial method with respect to the substrate 10. The blanket seed layer 12 is intended to provides a uniform crystalline replicated surface with respect to the substrate 10, such as to efficiently effect formation of additional epitaxially deposited layers thereupon. Typically, the optional blanket seed layer 12 is formed to a thickness of from about 10 to about 300 angstroms.

Within the invention, each of the blanket first silicon layer 16 and the blanket second silicon layer 20 is formed of a silicon material (optionally with an appropriate dopant, i.e., formed essentially of silicon), also formed employing an epitaxial method. Typically and preferably, each of the blanket first silicon layer 16 and the blanket second silicon layer 20 is formed to a thickness of from about 10 to about 300 angstroms.

Within the invention, each of the blanket first silicon-germanium alloy layer 14 and the blanket second silicon-germanium alloy layer 18 is also formed employing an epitaxial method. In addition, each of the blanket first silicon-germanium alloy layer 14 and the blanket second silicon-germanium alloy layer 18 is formed of a thickness less than a threshold thickness above which dislocation defects form and propagate within a silicon germanium material (optionally with appropriate dopant) from which is formed the blanket first silicon-germanium alloy layer 14 and the blanket second silicon-germanium alloy layer 18.

Figure 3:
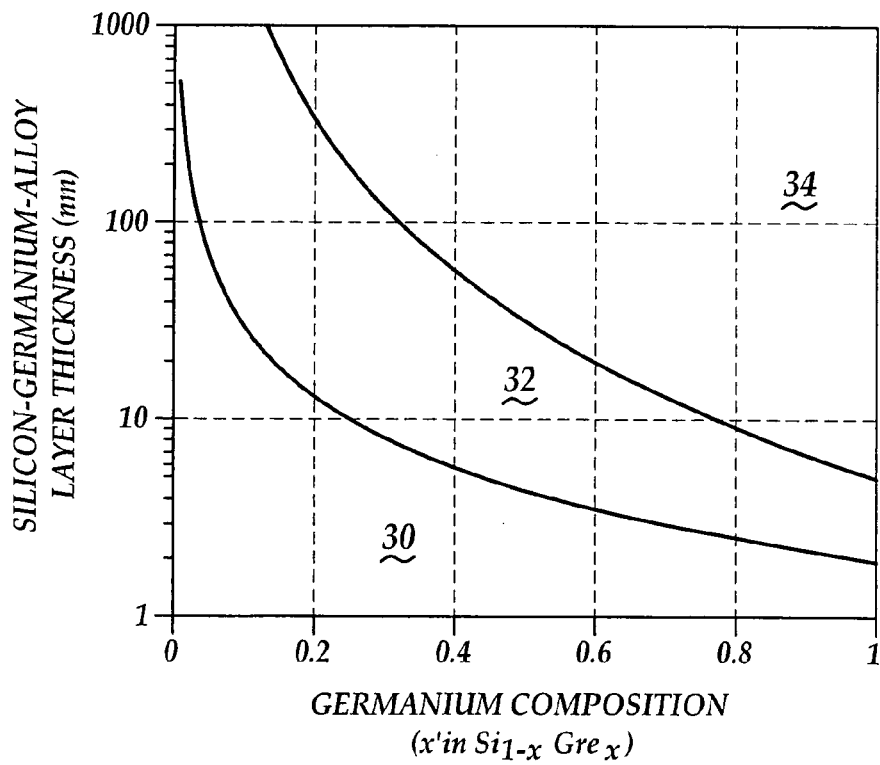
FIG. 3 shows a graph of Silicon-Germanium Alloy Layer Thickness versus Germanium Composition, as employed within the context of the preferred embodiment of the invention.

Such a thickness may be determined in accord with the graph of FIG. 3, which illustrates Silicon-Germanium Alloy Layer Thickness versus Germanium Composition for silicon-germanium alloy materials. As is illustrated within the graph of FIG. 3, the area which corresponds with reference numeral 30 corresponds with stable dislocation free silicon-germanium alloy material layers, the area which corresponds with reference numeral 32 corresponds with metastable silicon-germanium alloy material layers and the area which corresponds with reference numeral 34 corresponds with relaxed but dislocation defect prone silicon-germanium alloy material layers. As is also understood from review of the data within FIG. 3, silicon layers in accord with the above thickness limitations in accord with the invention will also be formed absent dislocation defects.

As an example within the context of the invention, and for a germanium composition within a silicon-germanium alloy layer of up to about 40 atomic percent (i.e., $Si_{0.6}Ge_{0.4}$), and preferably from about 10 to about 40 atomic percent, the present invention contemplates a silicon-germanium alloy layer thickness of less than about 400 angstroms, and preferably from about 100 to about 300 angstroms, for forming the first silicon-germanium alloy layer 14 and the second silicon-germanium alloy layer 18 absent dislocation defects.

The invention may also employ additional silicon-germanium alloy layer/silicon layer laminated pairs beyond the second silicon-germanium alloy layer 18 and the second silicon layer 20. However, the present invention contains the minimum of two silicon-germanium alloy layers 14 and 18 and the minimum of two silicon layers 16 and 20, as illustrated with the geometric disposition as illustrated within FIG. 1.

The strained silicon layer fabrication of FIG. 1 may by itself serve adequately in some circumstances for forming semiconductor devices within the second silicon layer 20, which will have some strain induced therein incident to having been formed upon the second silicon germanium alloy layer 18. However, from a practical perspective, neither the second silicon layer 20 nor the second silicon-germanium alloy layer 18 may necessarily be formed with a sufficient or appropriate thickness to provide optimal strain and thus optimal semiconductor device performance. Thus, it is preferred within the invention to employ the strained silicon layer fabrication of FIG. 1 as a substrate for an additional silicon-germanium alloy layer having formed thereupon an additional silicon layer. Such a strained silicon layer fabrication is illustrated within FIG. 2.

FIG. 2 illustrates a third silicon-germanium alloy layer 22 (which is generally a relaxed layer) formed upon the second silicon layer 20. FIG. 2 also illustrates a third silicon layer 24 (which is generally a more highly strained silicon layer for channeling) formed upon the third silicon-germanium alloy layer 22.

Within the invention, the third silicon-germanium alloy layer 22 is typically formed of a single (i.e., non-graded) silicon-germanium alloy material of content analogous or identical to the germanium content of the first silicon-germanium alloy layer 14 and the second silicon-germanium alloy layer 18 (which are preferably also formed of a single non-graded silicon-germanium alloy material). Typically, the third silicon-germanium alloy layer 22 is formed to a thickness of from about 200 nm to about 3 μm, which exceeds a threshold thickness for dislocation defect formation.

Within the invention, the third silicon layer 24 is formed employing methods and materials analogous or equivalent to the methods and materials employed for forming the first silicon layer 16 and the second silicon layer 20. Typically, the third silicon layer 24 is formed to a thickness of from about 100 to about 400 angstroms.

FIG. 2 illustrates a strained silicon layer fabrication in accord with the preferred embodiment of the invention. The strained silicon layer fabrication is formed with attenuated dislocation defects insofar as the strained silicon layer fabrication is formed with a plurality of silicon-germanium alloy layers each formed of a thickness less than a critical thickness above which a dislocation defect is formed within a silicon-germanium alloy layer.

While not wishing to be bound to any particular theory of operation of the invention, it is believed that while the third silicon layer is strained and the third silicon-germanium alloy layer is relaxed due at least in part to their relative thicknesses, dislocation stresses formed incident to the lattice mismatch of the third silicon layer 24 with respect to the third silicon-germanium alloy layer 22 are transmitted to the stack of the first silicon-germanium alloy layer 14, the first silicon layer 16, the second silicon germanium alloy layer 18 and the second silicon layer 20, where they are trapped and contained absent formation of dislocation defects since that stack of layers is formed of thicknesses which preclude formation of dislocation defects.

The preferred embodiment of the invention is illustrative of the invention rather than limiting of the invention. Revisions and modifications may be made to various parameters employed for forming a strained silicon layer fabrication in accord with the preferred embodiment of the invention while still providing a strained silicon layer fabrication in accord with the invention, further in accord with the accompanying claims.

What is claimed is:

1. A strained silicon layer fabrication comprising:
    a semiconductor substrate;
    a first silicon-germanium alloy layer formed on the semiconductor substrate;
    a first silicon layer formed upon the first silicon-germanium alloy layer;
    a second silicon-germanium alloy layer, the second silicon-germanium alloy layer being formed upon the first silicon layer; and
    a second silicon layer, the second silicon layer being formed upon the second silicon-germanium alloy layer, wherein each of the first silicon-germanium alloy layer and the second silicon-germanium alloy layer is formed to a thickness less than a threshold thickness for dislocation defect formation.

2. The strained silicon layer fabrication of claim 1 wherein each of the first silicon layer and the second silicon layer is also formed to a thickness less than a threshold thickness for dislocation defect formation.

3. The strained silicon layer fabrication of claim 1 wherein each of the first silicon-germanium alloy layer and the second silicon-germanium alloy layer is formed of a uniform composition and ungraded silicon-germanium alloy material.

4. The strained silicon layer fabrication of claim 1 wherein:
    a germanium content in each of the first silicon-germanium alloy layer and the second silicon-germanium alloy layer is from about 10 to about 40 atomic percent;
    each of the first silicon-germanium alloy layer and the second silicon-germanium alloy layer is formed to a thickness of from about 100 to about 400 angstroms; and
    each of the first silicon layer and the second silicon layer is formed to a thickness of from about 10 to about 300 angstroms.

5. The strained silicon layer fabrication of claim 1 wherein:
    the third silicon-germanium alloy layer is formed of a thickness greater than a threshold thickness for dislocation defect formation;
    the third silicon-germanium alloy layer is a relaxed layer; and
    the third silicon layer is a strained silicon layer.

6. A method for forming a strained silicon layer fabrication comprising:
    providing a semiconductor substrate;
    forming a first silicon-germanium alloy layer on the semiconductor substrate;
    forming a first silicon layer upon the first silicon-germanium alloy layer;
    forming a second silicon-germanium alloy layer, the second silicon-germanium alloy layer being formed upon the first silicon layer;
    forming a second silicon layer, the second silicon layer being formed upon the second silicon-germanium alloy layer, wherein each of the first silicon-germanium alloy layer and the second silicon-germanium alloy layer is formed to a thickness less than a threshold thickness for dislocation defect formation.

7. The method of claim 6 wherein each of the first silicon layer and the second silicon layer is also formed to a thickness less than a threshold thickness for dislocation defect formation.

8. The method of claim 6 wherein each of the first silicon germanium alloy layer and the second silicon-germanium alloy layer is formed of a uniform composition and ungraded silicon-germanium alloy material.

9. The method of claim 6 wherein:
    a germanium content in each of the first silicon-germanium alloy layer and the second silicon-germanium alloy layer is from about 10 to about 40 atomic percent;
    each of the first silicon-germanium alloy layer and the second silicon-germanium alloy layer is formed to a thickness of from about 100 to about 400 angstroms; and
    each of the first silicon layer and the second silicon layer is formed to a thickness of from about 10 to about 300 angstroms.

10. The method of claim 6 wherein:
    the third silicon-germanium alloy layer is formed of a thickness greater than a threshold thickness for dislocation defect formation;
    the third silicon-germanium alloy layer is a relaxed layer; and
    the third silicon layer is a strained silicon layer.

11. A strained silicon layer fabrication comprising:
    a semiconductor substrate;
    a first silicon-germanium alloy layer formed on the semiconductor substrate;
    a first silicon layer formed upon the first silicon-germanium alloy layer;
    a minimum of a second silicon-germanium alloy layer, the second silicon-germanium alloy layer being formed upon the first silicon layer;
    a minimum of a second silicon layer, the second silicon layer being formed upon the second silicon-germanium alloy layer, wherein each of the first silicon-germanium alloy layer and the second silicon-germanium alloy layer is formed to a thickness less than a threshold thickness for dislocation defect formation;
    a third silicon-germanium alloy layer formed upon the second silicon-germanium alloy layer; and
    a third silicon layer formed upon the third silicon-germanium alloy layer.

12. The strained silicon layer fabrication of claim 11 wherein:
    the third silicon-germanium alloy layer is formed of a thickness greater than a threshold thickness for dislocation defect formation;
    the third silicon-germanium alloy layer is a relaxed layer; and
    the third silicon layer is a strained silicon layer.

* * * * *